US008877581B2

(12) United States Patent
Jain et al.

(10) Patent No.: US 8,877,581 B2
(45) Date of Patent: Nov. 4, 2014

(54) STRAIN-ENGINEERED MOSFETS HAVING RIMMED SOURCE-DRAIN RECESSES

(75) Inventors: Amitabh Jain, Allen, TX (US); Deborah J. Riley, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 268 days.

(21) Appl. No.: 12/855,736

(22) Filed: Aug. 13, 2010

(65) Prior Publication Data

US 2011/0042753 A1    Feb. 24, 2011

Related U.S. Application Data

(60) Provisional application No. 61/236,371, filed on Aug. 24, 2009.

(51) Int. Cl.
*H01L 29/78* (2006.01)
*H01L 21/8238* (2006.01)

(52) U.S. Cl.
CPC .... *H01L 21/823814* (2013.01); *H01L 29/7848* (2013.01); *H01L 21/823807* (2013.01)
USPC ........... 438/229; 438/230; 438/231; 438/232; 257/369; 257/E21.634; 257/E27.062

(58) Field of Classification Search
CPC .................................................. H01L 27/092
USPC ........... 257/368, 19, E21.409; 438/285, 275, 438/229, 231, 232, 230
See application file for complete search history.

(56) References Cited

U.S. PATENT DOCUMENTS

| | | | | |
|---|---|---|---|---|
| 7,402,872 | B2 * | 7/2008 | Murthy et al. | 257/382 |
| 7,719,060 | B2 * | 5/2010 | Wei et al. | 257/368 |
| 7,776,697 | B2 * | 8/2010 | Currie et al. | 438/285 |
| 2009/0065867 | A1 | 3/2009 | Yin et al. | |

* cited by examiner

*Primary Examiner* — Marc Armand
(74) *Attorney, Agent, or Firm* — Jacqueline J. Garner; Frederick J. Telecky, Jr.

(57) ABSTRACT

An integrated circuit (IC) includes a plurality of strained metal oxide semiconductor (MOS) devices that include a semiconductor surface having a first doping type, a gate electrode stack over a portion of the semiconductor surface, and source/drain recesses that extend into the semiconductor surface and are framed by semiconductor surface interface regions on opposing sides of the gate stack. A first epitaxial strained alloy layer (rim) is on the semiconductor surface interface regions, and is doped with the first doping type. A second epitaxial strained alloy layer is on the rim and is doped with a second doping type that is opposite to the first doping type that is used to form source/drain regions.

20 Claims, 4 Drawing Sheets

STRAIN-ENGINEERED MOSFETS HAVING RIMMED SOURCE-DRAIN RECESSES

CROSS REFERENCE TO RELATED APPLICATIONS

This application and the subject matter disclosed herein claims the benefit of Provisional Application Ser. No. 61/236,371 entitled "Method for Forming an In-Situ Doped Source-Drain Rim to Reduce Punch-Through and Improve Short-Channel Behavior of Strain-Engineered MOSFETs", filed Aug. 24, 2009, which is herein incorporated by reference in its entirety.

FIELD

Disclosed embodiments relate to integrated circuits (ICs) including strained MOS devices that include stress layer filled source/drain recesses.

BACKGROUND

As the semiconductor industry pushes the performance boundary of CMOS for the increasing circuit capability (i.e., reduction of channel resistance and power consumption, and increase in drive current, frequency response and operating speed), transistor architectures have turned to increased built-in mechanical channel stress to enhance carrier mobility. As known in the art, stress layers can increase electron mobility in the channel for n-metal oxide semiconductor field effect (n-MOS) devices and hole mobility in the channel for p-MOS devices. For a n-MOS device, tensile stress is induced by a stress layer, such as an epitaxial silicon-carbon (e-SiC) layer, that can cause the mobility of electrons to increase. On the other hand, when the CMOS device is a p-MOS device, the compressive stress caused by an e-SiGe can cause the mobility of the holes to increase.

The stress layer may be positioned in various locations relative to the channel of the device. In one arrangement, the channel stress is increased by forming source/drain recesses and epitaxially depositing alloyed silicon in the recesses. To achieve maximum effect, the stress inducing regions need to be close to the channel region of the devices. However, stress layer proximity is known to result in problems including an increase in device leakage in the off-state so that a maximum or near maximum stress effect is not realizable.

SUMMARY

Disclosed embodiments describe ICs including stress enhanced MOS devices having rimmed source-drain filled recesses and methods for fabricating such devices that allow the stress inducing regions to be positioned close to the channel region of the MOS devices, without resulting in problems such as a substantial increase in transistor leakage in the off-state. Disclosed embodiments introduce a dopant of the same conductivity type as the substrate surface (e.g., well) region (and thus doped oppositely relative to the source/drain doping) at the beginning of the recess filling epitaxy process to form an in-situ rim around the later epitaxy which at least fills the recesses that becomes part of the source and drain regions.

Disclosed embodiments can provide improved device performance by allowing the electric field from the drain to uncover sufficient charge without extending too much in the semiconductor under the gate stack and towards the channel region. This eliminates or at least reduces the problem described above for conventional stress layers and allows the epitaxial stress inducing regions to be positioned closer to the channel of the MOS device. Accordingly, disclosed embodiments provide increased channel stress and result in a mobility improvement over conventional MOS devices that include stress layer filled source/drain recesses.

In one embodiment, a method of fabricating an IC including a plurality of strained MOS devices comprises providing a substrate having a semiconductor surface that has a first doping type, and forming a gate electrode stack over a portion of the semiconductor surface. Source/drain recesses are formed that extend into the semiconductor surface on opposing sides of the gate electrode stack, wherein the source/drain recesses are framed by semiconductor surface interface regions. A first strained alloy layer that includes a strain inducing alloy element has a shape resembling a rim or halo referred to herein as a "rim" is epitaxially deposited on the semiconductor surface interface regions. The rim is doped with the first doping type. The thickness of the rim is generally 25 to 100 Angstroms. A second strained alloy layer that generally includes the same strain inducing alloy element that is in the rim is epitaxially deposited on the rim to at least fill the recesses. The second strained alloy layer can be deposited undoped (and can be later doped), or can be deposited doped (in-situ) with a second doping type that is opposite to the first doping type.

DETAILED DESCRIPTION

Figure 1:
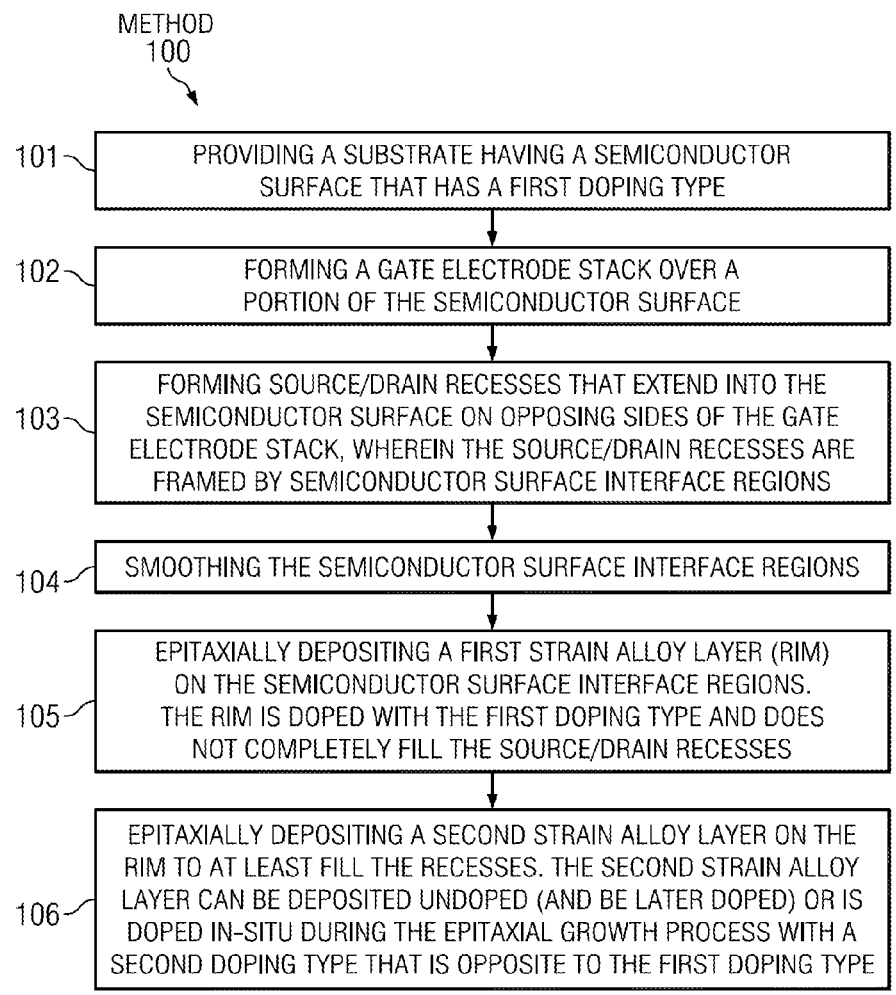
FIG. 1 is a flow chart that shows steps in an exemplary method for forming stress enhanced MOS devices having filled rimmed source-drain recesses, according to an embodiment of the invention.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

FIG. 1 is a flow chart that shows steps in an exemplary method 100 for forming stress enhanced MOS transistors having filled rimmed source-drain recesses, according to an embodiment of the invention. Step 101 comprises providing a substrate having a semiconductor surface that has a first doping type. The substrate generally includes any semiconductor material including, for example, Si, SiC, SiGeC, Ge, SiGe, Ga, GaAs, InAs, InP as well as other III/V or II/VI compound semiconductors. Layered semiconductors such as, for example, Si/SiGe and semiconductor-on-insulators (SOIs) are also contemplated herein. Typically, the substrate is a Si-containing semiconductor such as, for example, Si, SiC, SiGe, SiGeC, or a silicon-on-insulator or any of the above-mentioned substrate material or combination thereof on insulator. The substrate may be intrinsic or it may be doped with, for example, but not limited to B, As or P.

The semiconductor surface can include at least one well region type. For example, in one arrangement there is a p-well for n-MOS devices and a n-well for p-MOS devices.

Step 102 comprises forming a gate electrode stack over a portion of the semiconductor surface. The gate electrode can comprise numerous gate electrode materials, and the gate dielectric layer can comprise numerous gate dielectric layers, including a high-k dielectric layer in one embodiment.

Step 103 comprises forming source/drain recesses that extend into the semiconductor surface on opposing sides of the gate stack, wherein the source/drain recesses following formation are framed by semiconductor surface interface regions. Forming the recesses generally comprises plasma etching and/or wet etching. In one embodiment wet etching follows plasma etching.

Wet etching can utilize the phenomena where for certain crystalline materials, the wet etch rate is lower on the more densely packed surface as compared to the etch rate for a loosely packed surface. For example, the wet etch of (100) silicon has a wet etch rate for (100)>etch rate for (111) that results in formation of diamond shaped recesses (See FIG. 2A). For wet etching silicon, the etchant can comprise hydroxides such as $NH_4OH$ or Tetramethylammonium Hydroxide (TMAH).

The shape of the recesses can be controlled by controlling the time and conditions for the plasma etch, as well as the time for the wet etch. With appropriately shaped recesses, the portion of the rim that begins just under (e.g. 200 to 400 A) the channel interface of the MOS device can be exploited to provide a retrograde doping character to the channel doping that provides certain MOS device performance advantages.

Step 104 comprises the optional smoothing the semiconductor surface interface regions. The Inventors have recognized that by smoothing the interface at which epitaxy is performed reduces imperfections or other defects that can nucleate during epitaxial growth that can result in generation of defects such as misfit dislocations. Exemplary smoothing processes include ionized cluster beam processing or the so-called SICONI™ process (Applied Materials, Santa Clara, Calif.), or these two processes in combination.

Step 105 comprises epitaxially depositing a first strained alloy layer ("rim") on the semiconductor surface interface regions. The rim comprises the semiconductor surface material (e.g. silicon) and a strain inducing alloy element (e.g., Ge for p-MOS and C for n-MOS). As noted above, the typical thickness for the rim is 25 to 100 A, but the rim can be thicker or thinner than this range. The epitaxy is selective epitaxial growth as it takes place only in the etched recesses formed in the substrate surface. As known in the art and used herein the term "epitaxy" with resulting epitaxial layers refers to the method of depositing a monocrystalline film on a monocrystalline substrate, where the deposited film is denoted as an epitaxial film or epitaxial layer. Epitaxial films may be grown from gaseous or liquid precursors. Because the substrate acts as a seed crystal, the deposited epitaxial film takes on a lattice structure and orientation identical to those of the substrate. Epitaxy is thus different from other thin-film deposition methods which deposit polycrystalline or amorphous films, even on single-crystal substrates.

The rim is doped with the first doping type (i.e., doping type as the substrate or well surface) with a typical doping range of $1\,E18\,cm^{-3}$ to $1\,E19\,cm^{-3}$. However, the doping level in the rim can be higher or lower than this range. The rim does not completely fill the source/drain recesses. One embodiment applied to p-MOS devices fills the rim of the source/drain recesses with n-doped SiGe by introducing a group V dopant or dopants during the initial epitaxial layer deposition by use of suitable gaseous chemicals based on standard epitaxy engineering practice. The group V dopant or dopants can be selected from As, P or Sb. The choice of dopant(s) may further enhance the stress provided as an additional benefit, for example, As and to a greater degree Sb, add to the beneficial stress effect of Ge in Si for p-MOS.

For n-MOS devices, carbon (C) can be introduced together with Si to form a Si:C fill of the recesses. In this case the rim is doped with a Group III dopant, such as B or In.

Step 106 comprises epitaxially depositing a second strained alloy layer on the rim to at least fill the recesses. The second strained alloy layer generally includes the same strain inducing alloy element that is in the rim. In a typical embodiment, the epitaxial growth process is continued during growth of the second strained alloy layer to provide raised (relative to the top semiconductor surface) regions that after source/drain doping become the top portion of source/drain regions (See FIGS. 2A and 2B, for example). The second strained alloy layer can be deposited undoped (and be later doped, such as by ion implantation) or be doped in-situ during the epitaxial growth process with a second doping type that is opposite to the first doping type. A typical doping range for the second strained alloy layer is from $1\,E19\,cm^{-3}$ to $5\,E20\,cm^{-3}$ In a typical embodiment, steps 105 and 106 are part of a single recess filling selective epitaxy process that deposits a Si alloy layer material (e.g. SiGe for p-MOS). In this embodiment in step 105 a dopant of the same conductivity type as the substrate surface (or well) region is used at the beginning of the recess filling epitaxy to provide an in-situ rim around the source and drain regions. After the rim is formed, the silicon alloy layer deposition continues, but the stream(s) of dopant can be discontinued allowing a switch over to the other dopant type appropriate for source drain action, or in one embodiment no doping if it is desired to rely on a later processing for the doping, to begin step 106.

During any stage of the recess filling epitaxy, the dopant concentration may be varied to allow a graded dopant profile, such as increasing dopant concentration as the step 106 epitaxy proceeds. Moreover, during any stage of the recess filling epitaxy, the alloy element concentration may be varied, such as to increase the concentration of the alloy element as step 106 proceeds. The strain inducing alloy element in the second strained alloy layer can have a graded concentration profile that provides an increase of at least 5 atomic % in a concentration of the strain inducing element as the epitaxial deposition of the second strained alloy layer proceeds. For example, for p-MOS, the Ge concentration can begin at <25 at. %, such as 20 to 25 at. %, and increase monotonically or stepwise to be 30 to 50 at. % upon completion. In addition, species such as C, F and N may be introduced during epitaxial growth for diffusion and dislocation control.

Figure 2C:
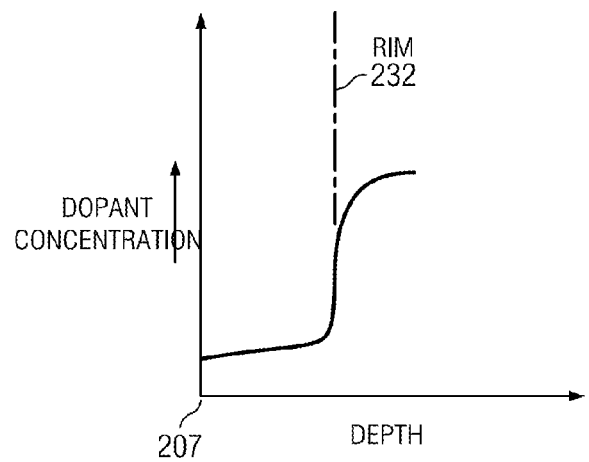
FIG. 2C is a depiction of the doping as a function of distance under the gate stack along the full length of the channel region for MOS device shown in FIG. 2B.

Although not described herein, as known in the art, steps subsequent to step 106 generally include LDD implantation, spacer formation, source/drain implantation and activation, and BEOL processing. The LDD and source/drain doping is within the strained epitaxial layers and also generally extends a distance beyond, such as shown in FIGS. 2A and 2B described below.

Figure 2A:
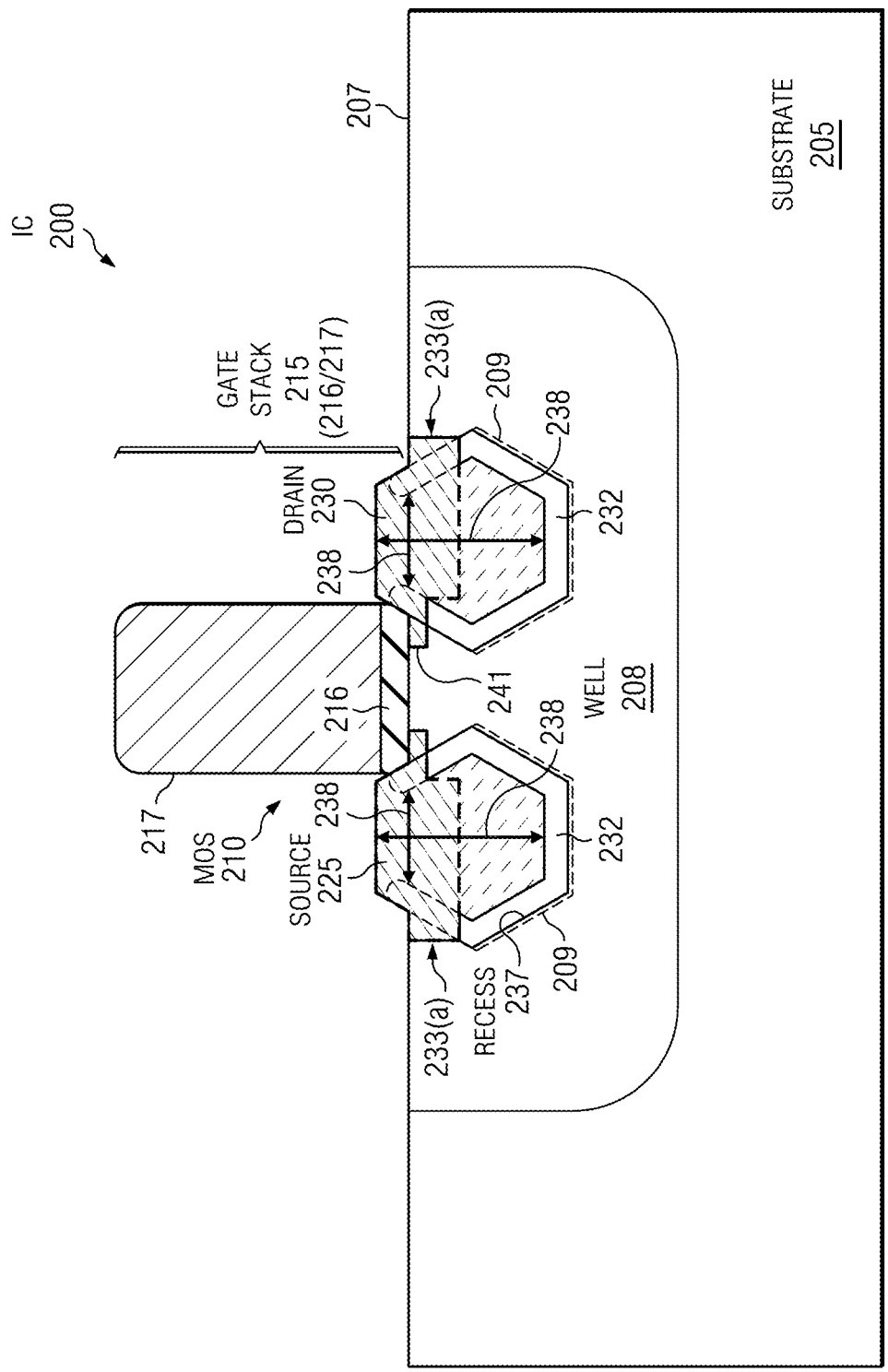
FIG. 2A is a cross sectional view of an IC including a stress enhanced MOS device having filled rimmed source-drain recesses, according to a disclosed embodiment.
Figure 2B:
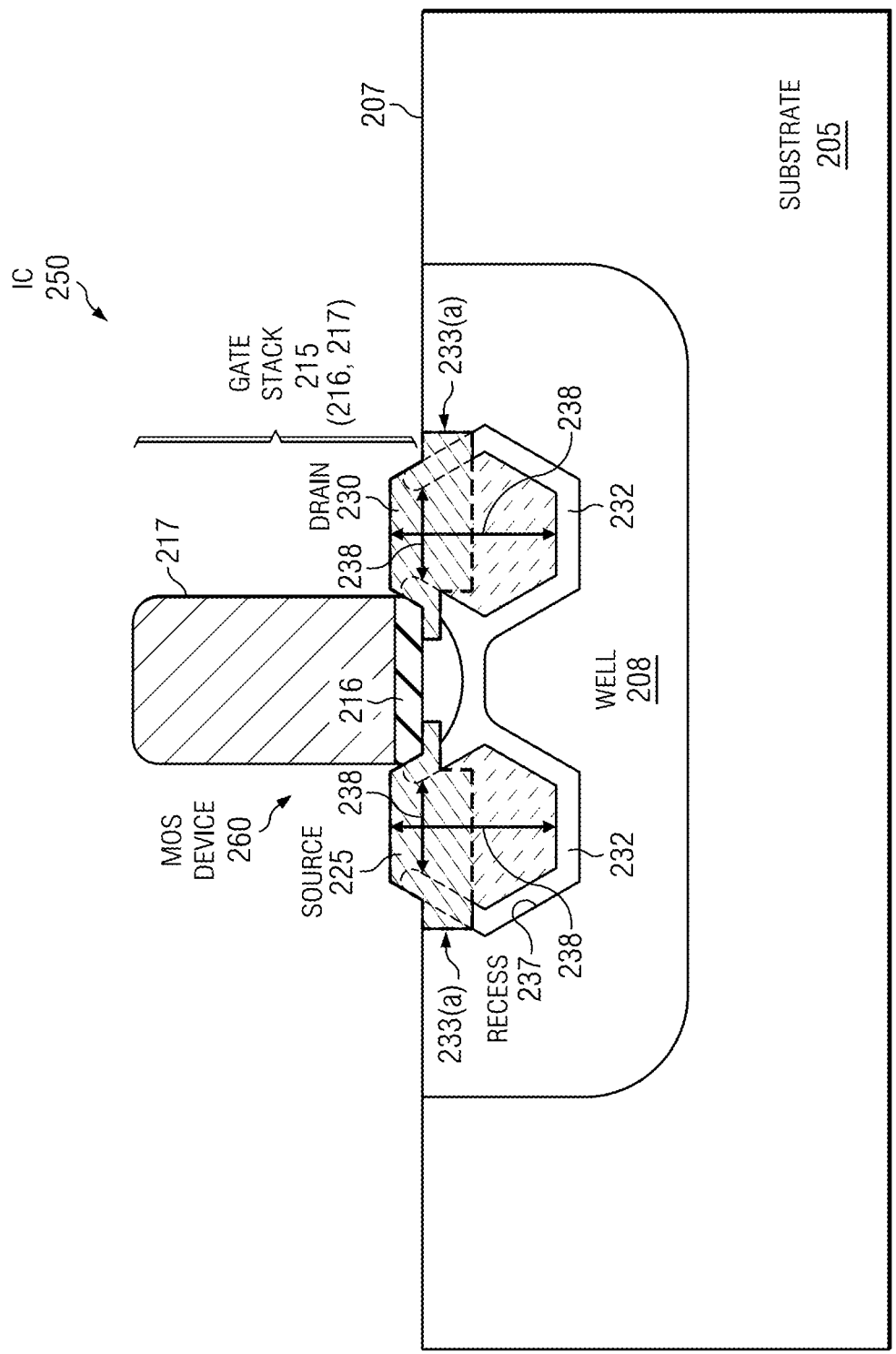
FIG. 2B is a cross sectional view of an IC including stress enhanced MOS device having filled rimmed source-drain recesses that connect the respective rimmed source and drain regions, so that the rimmed regions touch, according to another disclosed embodiment.

FIG. 2A is a cross sectional view of an IC 200 including a stress enhanced MOS device 210 having filled rimmed source-drain recesses, according to a disclosed embodiment. IC includes substrate 205 having substrate surface 207, and an optional well 208 (e.g. n-well or p-well) formed in the substrate 205. The well 208 can have the same or an opposite doping type relative to the doping type in the substrate 205.

The gate stack 215 is shown comprising gate electrode 217 on a gate dielectric 216. MOS device 210 also includes a source 225 and drain 230. What had been recesses 237 which are now filled are shown with dashed lines that depict a diamond shape, which are on both sides of the gate stack 215 and are framed by semiconductor interface regions 209, except at the top surface. Recesses 237 are shown first partially filled by rims 232 which are doped with the first doping type, with second strained alloy layers 238 doped with the second doping type shown filling the recesses 237 and extending above the substrate surface 207.

Source and drain regions 225 and 230 extend vertically down to the interface between second strained alloy layer 238 and rim 232. LDD portions 241 are also shown. The source 225 and drain 230 include surface regions 233(a) that are highly doped (e.g. by implanting with a high dose/low energy) on the surface of the MOS device 210 adjacent to the gate stacks 215 to form surface source/drain regions 233(a) having a high concentration (e.g. ≥1 E20 cm$^{-3}$) of the second doping type relative to the second doping type doping concentration in the second strained alloy layer 238 below source/drain regions 233(a). When MOS device 210 comprises n-MOS, the rim 232 is doped with n-type doping, such as n-doped SiGe. When MOS device 210 comprises p-MOS, the second epitaxial strained alloy layer 238 is doped with p-doping, such as p-doped SiGe.

In a typical embodiment, the IC includes a plurality of strained MOS devices comprising a plurality of strained p-MOS devices and a plurality of strained n-MOS devices. Typically, the two stresses are opposite in nature, i.e., one is compressive and the other is tensile, so that a compressive stress is applied to the p-MOS devices and a tensile stress is applied to the n-MOS devices.

For p-MOS devices, the first strained alloy layer 232 and second strained alloy layer 238 can both comprise SiGe, and the first strained alloy layer 232 can be doped with at least one group V dopant (e.g., P, As, or Sb). For the n-MOS devices, the first strained alloy layer 232 and the second strained alloy layer 238 can both comprise SiC, and the rim 232 can be doped with at least one group III dopant (e.g., B or In).

FIG. 2B is a cross sectional view of an IC 250 including a stress enhanced MOS device 260 having filled rimmed source-drain recesses that connect the respective rims 232 so that the rims 232 touch that are in contrast shown in FIG. 2A separated and on opposite sides of the MOS device 210, according to another disclosed embodiment. This structure can be obtained by preferential wet etching, such as for (100) silicon.

FIG. 2C is a depiction of the doping as a function of distance under the gate stack along the full length of the channel region for MOS device 260 shown in FIG. 2B. Rim region 232 is shown providing a highly retrograde doping profile, that when provided proximate (e.g., 200 to 400 Å away) to the substrate surface 207 under the gate stack 215, can provide performance enhancements for the device. In typical embodiments, the doping concentration in the rim is at least an order of magnitude greater than a doping concentration in a channel region in the semiconductor surface below the gate electrode stack.

Figure 3:
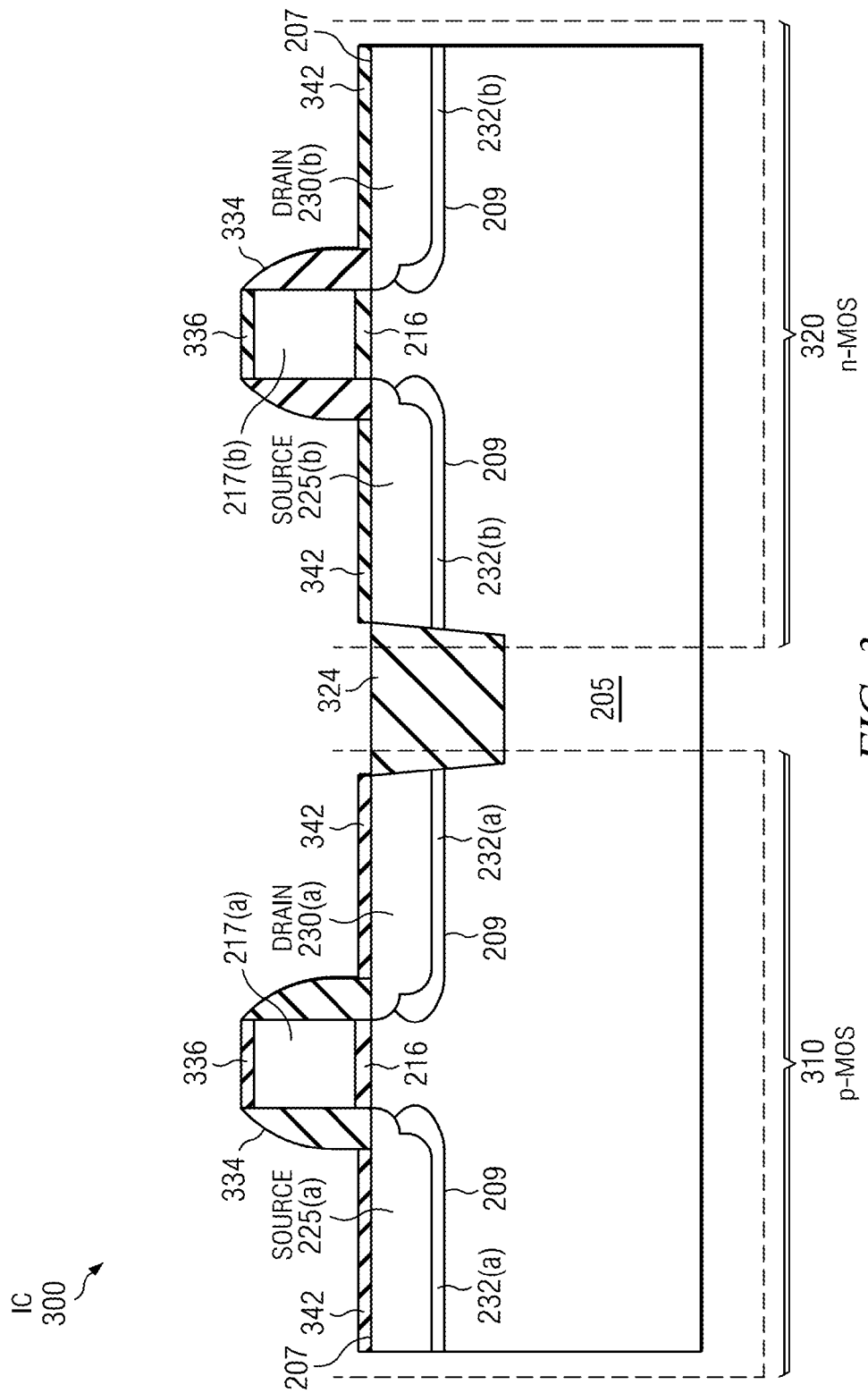
FIG. 3 is a cross sectional view of an IC including a stress enhanced p-MOS and a stress enhanced n-MOS device both having filled rimmed source-drain recesses, according to a disclosed embodiment.

FIG. 3 is a cross sectional view of an IC 300 including a stress enhanced p-MOS device 310 and a stress enhanced n-MOS 320 device both having filled rimmed source-drain recesses, according to a disclosed embodiment. The gate electrodes are shown in FIG. 3 as a gate electrode 217(a) for p-MOS 310 and gate electrode 217(b) for n-MOS 320, such as p+ and n+ polysilicon, respectively, for example. The gate electrodes 217(a) and 217(b) are shown including a gate silicide 336 thereon. Rims are shown as 232(a) for p-MOS 310 and 232(b) for n-MOS 320. The p-MOS 310 and n-MOS 320 devices are shown including a spacer 334, and source and drain silicide 342. p-MOS 310 is shown including source 225(a) and drain 230(a), while n-MOS 320 is shown including source 225(b) and drain 230(b). Shallow trench isolation (STI) 324 is shown for providing electrical isolation between the p-MOS 310 and n-MOS 320 devices.

As described above, with an appropriate shape for the recesses, the section of the rim that is just under the channel (e.g. 200 to 400 Å below the top of the substrate surface 207) can be exploited to give retrograde character to the channel doping, where the doping level in the rim 232(a) or 232(b) can be substantially higher as compared to the doping in semiconductor surface 207 directly under the gate stack 215. The section of the rim under the channel can be an edge portion of the channel as shown in FIG. 2A, or the entire channel length as shown in FIG. 2B. This new feature that allows for greater MOS threshold control as it can provide reduced local threshold voltage variation due to random dopant fluctuation in the channel region that can become a significant statistical effect as the size (i.e., volume) of the doped regions becomes increasingly small.

Improved threshold voltage control can lead to higher IC yields, such as for IC that include matching transistor based sub-circuits, for example SRAMs which can benefit from reduced mismatch between adjacent MOS devices. Thus, disclosed embodiments can extend the benefits of epitaxial construction to provide channel engineering. Moreover, as disclosed above, the alloying element (e.g., Ge or C) element concentration can be graded by starting with a low or zero concentration and increasing it as the epitaxy recess filling process progresses.

The active circuitry formed on the top semiconductor surface comprises circuit elements that generally include transistors, diodes, capacitors, and resistors, as well as signal lines and other electrical conductors that interconnect these various circuit elements. Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method of fabricating an integrated circuit (IC) including a plurality of strained metal oxide semiconductor (MOS) devices, comprising:
   providing a substrate having a semiconductor surface that has a first doping type;
   forming a gate electrode stack over a portion of said semiconductor surface;
   etching to form source/drain recesses that extend into said semiconductor surface to form recesses on opposing sides of said gate electrode stack, wherein said source/drain recesses are framed by semiconductor surface interface regions;
   epitaxially depositing a first strained alloy layer including a strain inducing alloy element on said semiconductor surface interface regions in the source/drain recesses, wherein said first strained alloy layer is doped with said first doping type, and
   epitaxially depositing a second strained alloy layer including a strain inducing alloy element on said first strain layer in the source/drain recesses, wherein said second strained alloy layer is undoped or is doped with a second doping type that is opposite to said first doping type.

2. The method of claim 1, wherein said substrate and said semiconductor surface both comprise silicon and said first strained alloy layer and said second strained alloy layer both comprise the same silicon alloy.

3. The method of claim 1, wherein said semiconductor surface comprises at least one well-type formed in said substrate.

4. The method of claim 1, wherein said plurality of strained MOS devices comprise at least one a p-MOS device, and said first strained alloy layer and said second strained alloy layers both comprises SiGe, and said first strained alloy layer is doped with at least one group V dopant.

5. The method of claim 1, wherein said plurality of strained MOS devices comprise at least one n-MOS device, and said first strained alloy layer and said second strained alloy layer both comprise SiC, and wherein said first strained alloy layer is doped with at least one group III dopant.

6. The method of claim 1, wherein said plurality of strained MOS devices comprise at least one n-MOS device and at least one p-MOS device.

7. The method of claim 1, wherein said second strained alloy layer is in-situ doped during said epitaxially depositing said second strained alloy layer with said second doping type.

8. The method of claim 1, wherein said strain inducing alloy element in said second strained alloy layer has a graded concentration profile that provides an increase of at least 5 atomic % in a concentration of said strain inducing element as said epitaxial deposition of said second strained alloy layer proceeds.

9. The method of claim 1, further comprising smoothing said semiconductor surface interface regions before said epitaxially depositing said first strained alloy layer.

10. The method of claim 9, wherein said smoothing comprises at least one of ionized cluster beam or a plasma-based cleaning chemistry.

11. An integrated circuit (IC) including a plurality of strained metal oxide semiconductor (MOS) devices, said plurality of strained MOS devices comprising:
   a substrate having a semiconductor surface having a first doping type;
   a gate electrode stack over a portion of said semiconductor surface;
   epitaxial filled recesses that extend into said semiconductor surface that are framed by semiconductor surface interface regions on opposing sides of said gate electrode stack, wherein said filled recesses comprise:
      a first epitaxial strained alloy layer (rim) including a strain inducing alloy element on said semiconductor surface interface regions, wherein said first strained alloy layer is doped with said first doping type, and
      a second epitaxial strained alloy layer including said strain inducing alloy element on said rim, wherein said second strained alloy layer is doped with a second doping type that is opposite to said first doping type,
   wherein source/drain regions are formed in said second epitaxial strained alloy layer.

12. The IC of claim 11, wherein said substrate and said semiconductor surface both comprise silicon and said first strained alloy layer and said second strained alloy layers both comprise the same silicon alloy.

13. The IC of claim 11, wherein said semiconductor surface comprises at least one well-type formed in said substrate.

14. The IC of claim 11, wherein said plurality of strained MOS devices comprise at least one a p-MOS device, and said first strained alloy layer and said second strained alloy layer both comprises SiGe, and said first strained alloy layer is doped with at least one group V dopant.

15. The IC of claim 11, wherein said plurality of strained MOS devices comprise at least one n-MOS device, and said first strained alloy layer and said second strained alloy layers both comprise SiC, and wherein said first strained alloy layer is doped with at least one group III dopant.

16. The IC of claim 11, wherein said plurality of strained MOS devices comprise at least one n-MOS device and at least one p-MOS device.

17. The IC of claim 11, wherein said second strained alloy element has a graded profile that increases monotonically with distance from said semiconductor surface interface regions.

18. The IC of claim 11, wherein said rim on said opposing sides of said gate electrode stack extend to meet one another.

19. The IC of claim 18, wherein a doping concentration in said rim is at least an order of magnitude greater than a doping concentration in a channel region in said semiconductor surface below said gate electrode stack.

20. The IC of claim 11, wherein said strain inducing alloy element in said second strained alloy layer has a graded concentration profile that provides an increase of at least 5 atomic % in a concentration of said strain inducing element as said epitaxial deposition of said second strained alloy layer proceeds.

* * * * *